United States Patent
Nakano

(10) Patent No.: US 11,004,650 B2
(45) Date of Patent: May 11, 2021

(54) MULTIPOLE LENS, ABERRATION CORRECTOR USING THE SAME, AND CHARGED PARTICLE BEAM APPARATUS

(71) Applicant: Hitachi High-Tech Corporation, Tokyo (JP)

(72) Inventor: Tomonori Nakano, Tokyo (JP)

(73) Assignee: HITACHI HIGH-TECH CORPORATION, Tokyo (JP)

(\*) Notice: Subject to any disclaimer, the term of this patent is extended or adjusted under 35 U.S.C. 154(b) by 0 days.

(21) Appl. No.: 16/638,855

(22) PCT Filed: Aug. 28, 2017

(86) PCT No.: PCT/JP2017/030744
§ 371 (c)(1),
(2) Date: Feb. 13, 2020

(87) PCT Pub. No.: WO2019/043759
PCT Pub. Date: Mar. 7, 2019

(65) Prior Publication Data
US 2020/0373117 A1     Nov. 26, 2020

(51) Int. Cl.
*H01J 37/141* (2006.01)
*H01J 37/153* (2006.01)
*H01J 37/26* (2006.01)

(52) U.S. Cl.
CPC .......... *H01J 37/141* (2013.01); *H01J 37/153* (2013.01); *H01J 37/26* (2013.01); *H01J 2237/1534* (2013.01)

(58) Field of Classification Search
CPC ........ H01J 37/141; H01J 37/153; H01J 37/26; H01J 2237/1534; H01J 2237/153; H01J 2237/1405
See application file for complete search history.

(56) References Cited

U.S. PATENT DOCUMENTS 4,251,728 A \* 2/1981 Pfeiffer ............... H01J 37/1475
                                                              250/396 ML
6,153,885 A \* 11/2000 Kendall .................. H01J 49/20
                                                              250/396 ML
(Continued)

FOREIGN PATENT DOCUMENTS

JP          S52077573 A      6/1977
JP       2004241190 A  \*   8/2004
(Continued)

OTHER PUBLICATIONS

ISA/210 International Search Report dated Nov. 21, 2017 in International Application PCT/JP2017/030744.

*Primary Examiner* — David E Smith
(74) *Attorney, Agent, or Firm* — Miles & Stockbridge, P.C.

(57) ABSTRACT

Stability of a power source required to operate an aberration corrector is lowered in a wire aberration corrector. Accordingly, a power source that is more inexpensive than a power source in the related art may be used and apparatus cost may be reduced. A multipole lens that is provided in an aberration corrector includes a plurality of pairs of current lines 101 to 112 that are each provided on the same plane in an axisymmetric manner around an optical-axis 100. The current lines each include a main line section 103 that is parallel to the optical-axis and a return line section 116 that faces the main line section. A current in the return line section flows in a direction opposite to a current in the main line section in components parallel to the optical-axis. A distance $R_2$ between the optical-axis and the return line section is larger than a distance $R_1$ between the optical-axis and the main line section. Noise caused by stability of a power source that supplies a current to the current lines in an excited multipole field is equal to or less than a predetermined level.

18 Claims, 6 Drawing Sheets

(56) References Cited

U.S. PATENT DOCUMENTS

| | | | |
|---|---|---|---|
| 7,947,964 B2* | 5/2011 | Ito | H01J 37/12 |
| | | | 250/396 ML |
| 2007/0181806 A1* | 8/2007 | Nakano | H01J 37/153 |
| | | | 250/310 |
| 2009/0032722 A1 | 2/2009 | Ito et al. | |
| 2009/0079531 A1 | 3/2009 | Zach et al. | |

FOREIGN PATENT DOCUMENTS

| | | |
|---|---|---|
| JP | 2004241190 A | 8/2004 |
| JP | 2009054581 A | 3/2009 |
| JP | 2009081138 A | 4/2009 |

* cited by examiner

[FIG. 1]
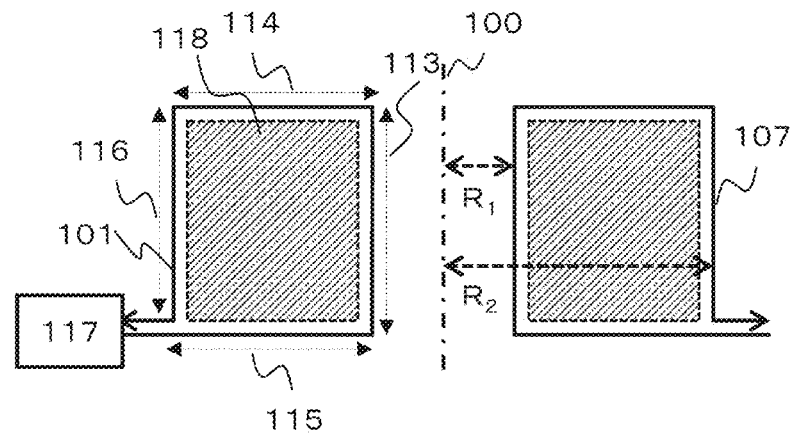
[FIG. 2]
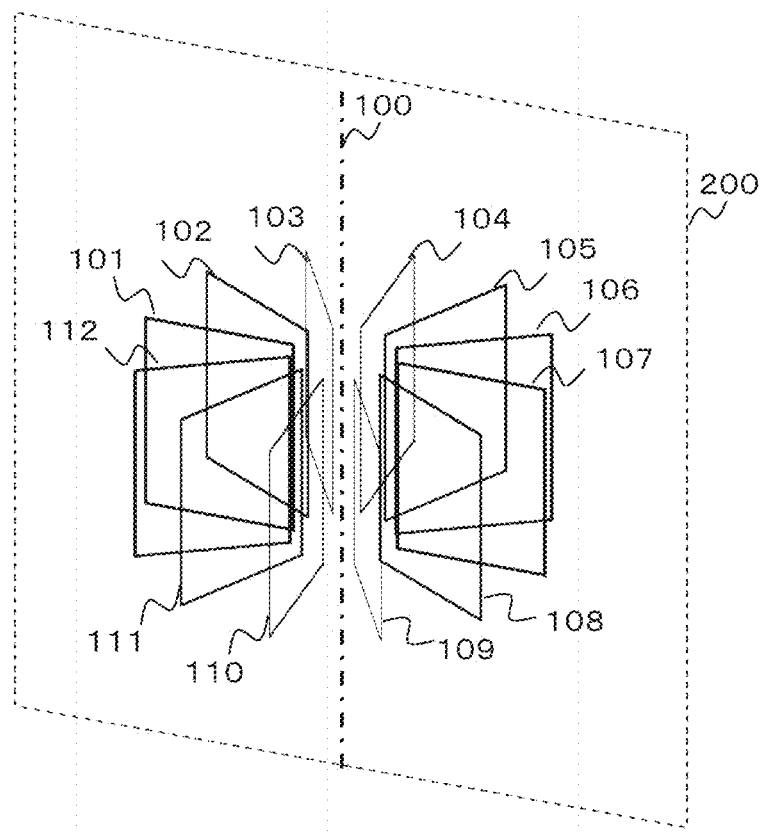

[FIG. 3]
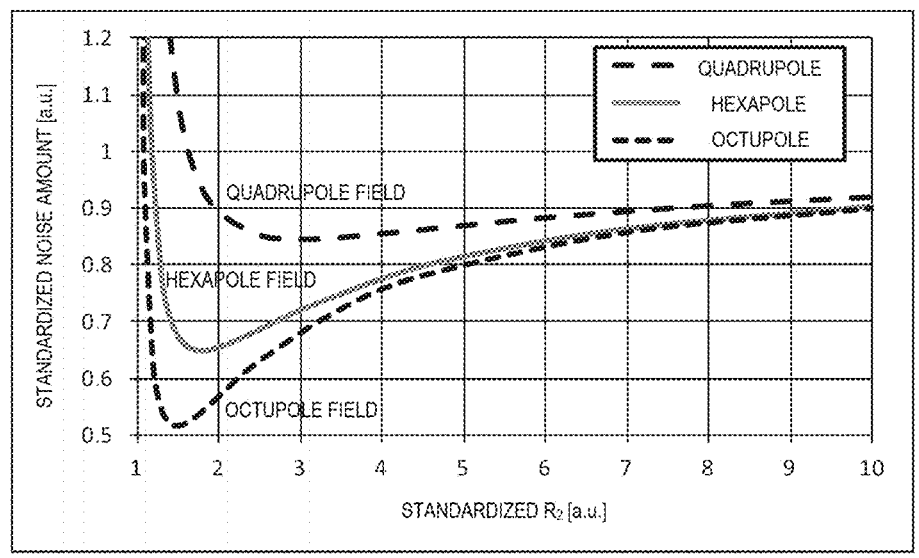
[FIG. 4]
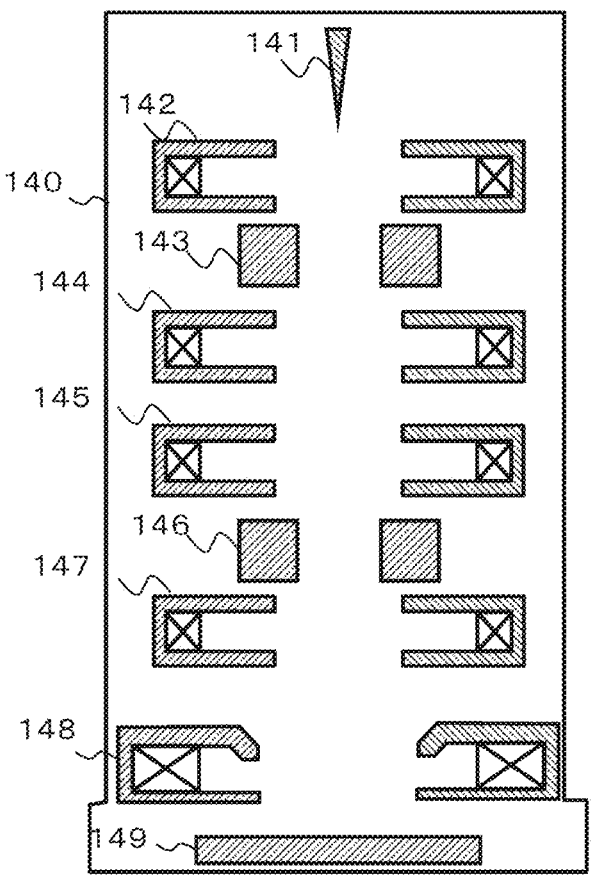

[FIG. 5]
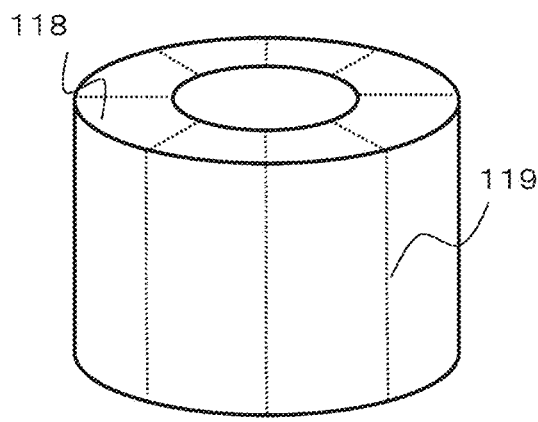
[FIG. 6]
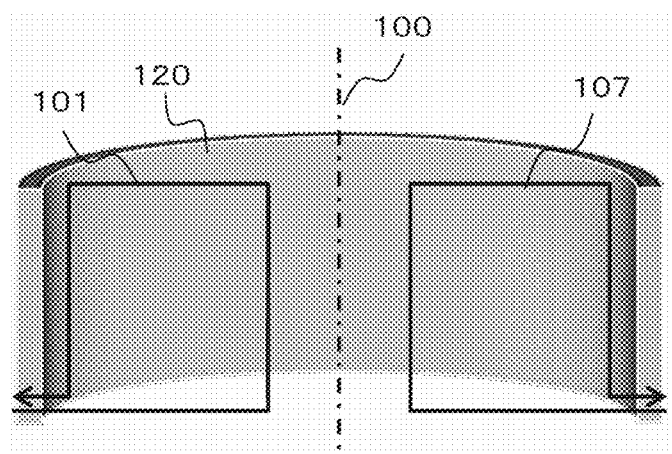

[FIG. 7]
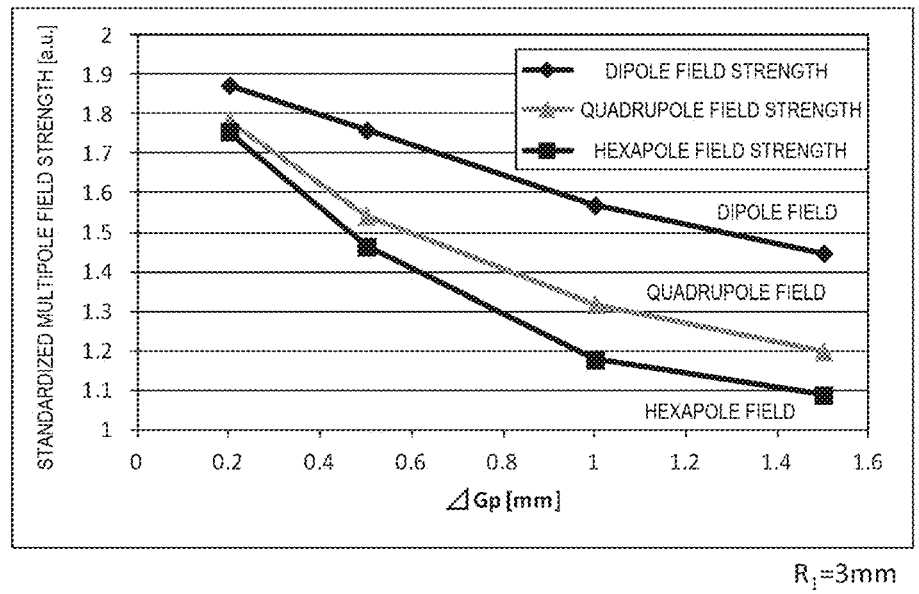
$R_1$=3mm
[FIG. 8]
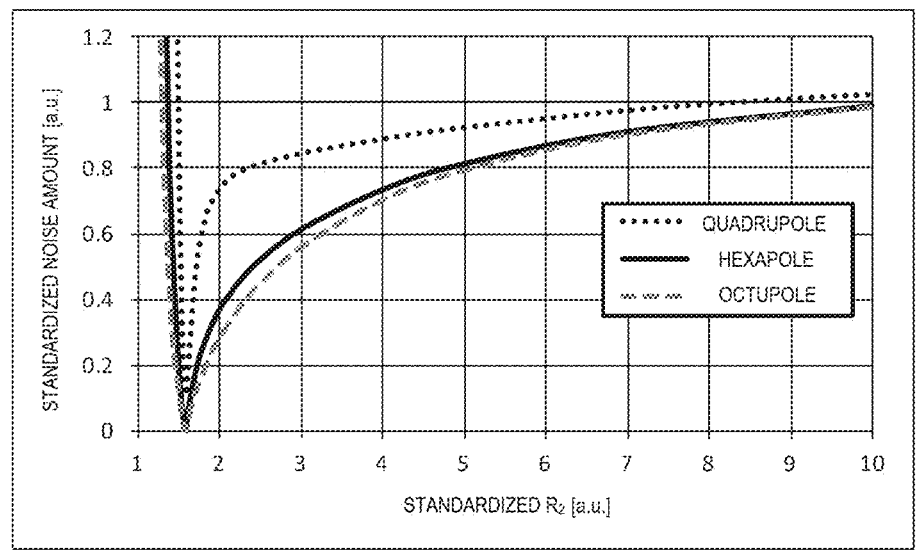
$R_1$=3mm
$\Delta Gp$=0.5mm

[FIG. 9]
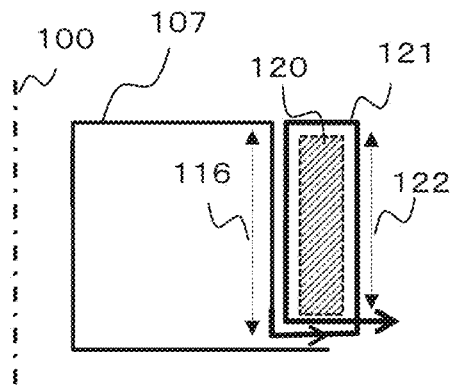
[FIG. 10]
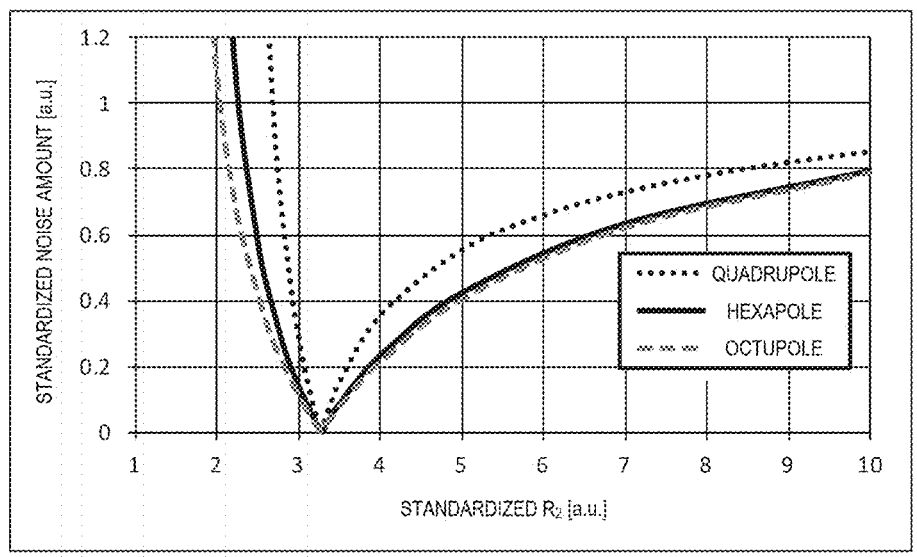

[FIG. 11]
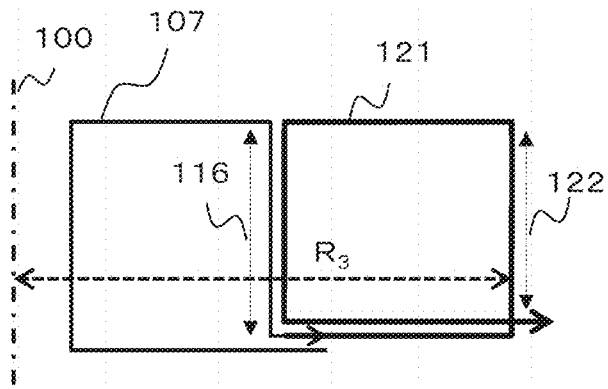
[FIG. 12]
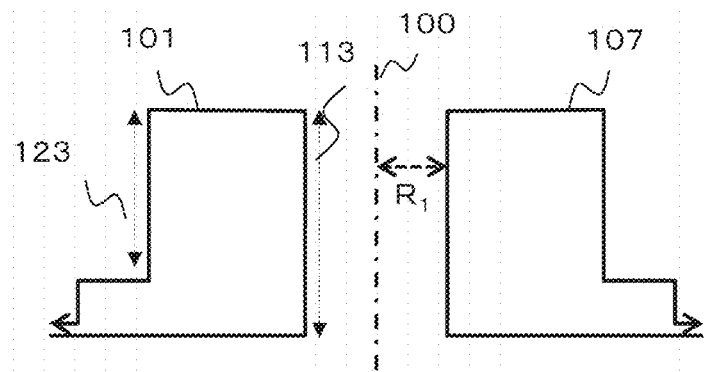
[FIG. 13]
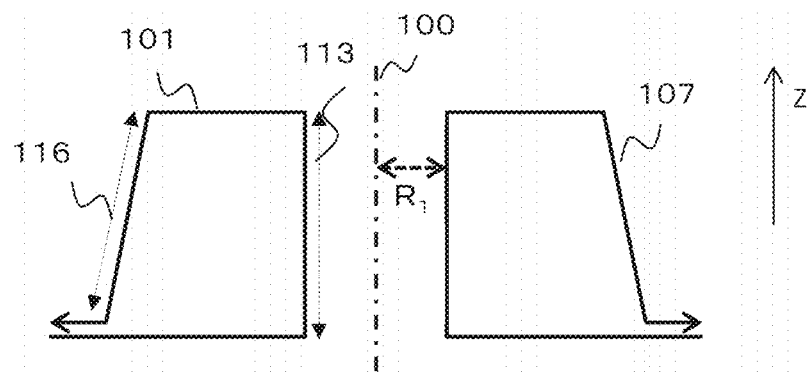

MULTIPOLE LENS, ABERRATION CORRECTOR USING THE SAME, AND CHARGED PARTICLE BEAM APPARATUS

TECHNICAL FIELD

The present invention relates to a charged particle beam application technique, and particularly relates to a charged particle beam apparatus that is provided with an aberration corrector, such as a scanning electron microscope and a transmission electron microscope.

BACKGROUND ART

An aberration corrector is introduced into a charged particle beam apparatus represented by a scanning electron microscope (SEM) and a scanning transmission electron microscope (STEM) in order to improve resolution. A type of aberration corrector includes a multipole lens provided in multiple stages. The multipole lens that combines a plurality of multipole fields by generating an electric field or a magnetic field corrects an aberration included in a charged particle beam that passes through an inside of the multipole lens. PTL 1 discloses an aberration corrector including a plurality of wedge metal poles that are radially provided in a central axis direction and each of the wedge metal poles is applied with an electric field or a magnetic field to generate a multipole field. PTL 2 and PTL 3 disclose wire aberration correctors that generate a multipole field using magnetic fields generated from a plurality of current lines. Both of the wedge and the wire aberration correctors require high mechanical position accuracy and high power source stability.

CITATION LIST

Patent Literature

PTL 1: JP-A-2004-241190
PTL 2: JP-A-2009-54581
PTL 3: JP-A-2009-81138

SUMMARY OF INVENTION

Technical Problem

Since the aberration corrector disclosed in PTL 1 requires high position accuracy at a pole tip end and a structure in which a magnetic coupling or shield is taken into consideration, the aberration corrector has a complicated structure in which a plurality of components are combined. Therefore, it is difficult to perform mass production which takes time and cost. Since a power source used to operate the corrector requires a highly stable power source, power source cost may increase.

PTL 2 discloses a wire aberration corrector. Although the aberration corrector is a relatively inexpensive aberration corrector in which a multipole field is formed using a current line, a principle of the aberration corrector using the multipole field is the same as a principle of the aberration corrector disclosed in PTL 1. Therefore, although cost of the aberration corrector may be reduced, a problem with regard to power source cost remains since a power source requires the same stability as in PTL 1.

In PTL 3, a multipole field is formed by using a quadrilateral wire that is provided at a certain distance from a central axis as a pole. Although cost of the aberration corrector may be considered as in the same level as the cost in PTL 2 since the aberration corrector is implemented by a current line, power source stability is not particularly taken into consideration and it is not considered that power source cost in PTL 3 is significantly different from the power source cost in PTL 1 and PTL 2.

Solution to Problem

A multipole lens according to one embodiment includes a plurality of pairs of current lines that are each provided on the same plane in an axisymmetric manner around an optical-axis. The current lines each include a main line section that is parallel to the optical-axis and a return line section that faces the main line section. A current in the return line section flows in a direction opposite to a current in the main line section in components parallel to the optical-axis. A distance between the optical-axis and the return line section is larger than a distance between the optical-axis and the main line section. Noise caused by stability of a power source that supplies a current to the current lines in an excited multipole field is equal to or less than a predetermined level. In addition, the multipole lens is used to form an aberration corrector and a charged particle beam apparatus.

Other problems and novel features will be apparent from description of the present specification and accompanying drawings.

Advantageous Effect

Stability of a power source required to operate an aberration corrector is lowered in a wire aberration corrector. Accordingly, a power source that is more inexpensive than the power sources in the related art can be used and apparatus cost can be reduced.

BRIEF DESCRIPTION OF DRAWINGS

FIG. 1 is a cross-sectional view (a schematic view) of a multipole lens.

FIG. 2 is a top view (a schematic view) of the multipole lens.

FIG. 3 is a diagram showing a relationship between $R_2$ and a noise amount.

FIG. 4 is a schematic view showing a configuration example of an entire scanning electron microscope provided with an aberration corrector.

FIG. 5 is a schematic view showing an example of mounting the multipole lens.

FIG. 6 is a schematic view showing another configuration of the multipole lens.

FIG. 7 is a diagram showing a relationship between $\Delta Gp$ and multipole field strength.

FIG. 8 is a diagram showing a relationship between $R_2$ and a noise amount.

FIG. 9 is a schematic view showing another configuration of the multipole lens.

FIG. 10 is a diagram showing a relationship between $R_2$ and a noise amount.

FIG. 11 is a schematic view showing another configuration of the multipole lens.

FIG. 12 is a schematic view showing another configuration of the multipole lens.

FIG. 13 is a schematic view showing another configuration of the multipole lens.

DESCRIPTION OF EMBODIMENTS

First Embodiment

An aberration corrector includes a multipole lens in multiple stages. FIG. 1 is a cross-sectional view (a schematic view) of a one-stage multipole lens in a wire aberration corrector. FIG. 2 is a top view (a schematic view) of the one-stage multipole lens. As shown in FIG. 2, the multipole lens is provided with twelve current lines including current lines 101 to 112. The current lines 101 to 112 are provided in an axisymmetric manner around an optical-axis 100 of a charged particle beam. FIG. 1 is a cross-sectional view of the multipole lens in a plane 200 shown in FIG. 2. The current line 101 and the current line 107 are provided in an axisymmetric manner around the optical-axis 100 of the charged particle beam on the same plane. The current line 101 and the current line 107 are positioned and winded on a bobbin 118. The bobbin 118 is formed of a non-magnetic body such as a resin. Similarly, the current line 102 and the current line 108, the current line 103 and the current line 109, the current line 104 and the current line 110, the current line 105 and the current line 111, the current line 106 and the current line 112 are respectively provided in an axisymmetric manner around the optical-axis 100 on the same plane.

A structure of the current lines will be described using the current line 101 as an example. The current line 101 has a quadrilateral circuit shape. A current is supplied from a power source 117. As shown in FIG. 1, the current line 101 is divided into four sections that respectively correspond to sides of the quadrilateral shape. The four sections are a main line section 113, a connection section 114, a connection section 115, and a return line section 116. The main line section 113 is parallel to the optical-axis 100 and is provided at a position apart from the optical-axis 100 at a distance $R_1$. The return line section 116 is parallel to the optical-axis 100 and is provided at a position apart from the optical-axis 100 at a distance $R_2$. A current in the main line section 113 flows in a direction opposite to a current in the return line section 116. Only the current line 101 is described in detail in FIG. 1 and the current line 107 has a configuration symmetrical to the current line 101 around the optical-axis 100.

Although a power source is omitted in a wire lens (the multipole lens) shown in FIG. 2, it is necessary to provide a current flow with a specific allocation during excitation of a multipole field. An example of a combination used for exciting a 2N-pole field (N is an integer equal to or larger than 1) includes a combination of current values calculated by Formula 1 using a reference current $A_N$ when currents $I_1$ to $I_{12}$ are respectively applied to the current lines 101 to 112.

$$I_i = A_N \cdot \cos(N(i-1)\pi/6)$$ [Formula 1]

Formula 1 shows a current allocation that excites a single multipole field. In contrast, a plurality of different multipole fields may be superimposed. In this case, the current lines 101 to 112 are respectively connected to different power sources.

A multipole field is formed by a magnetic field generated by the main line section, and accordingly wires other than the main line section are not necessary for an aberration correction in principle. Since the current in the return line section flows in a direction opposite to the current in the main line section, a multipole field generated by the return line section is in a direction opposite to the multipole field generated by the main line section and the multipole field generated by the return line section has an effect of reducing strength of the multipole field generated by the main line section. Therefore, measures are considered necessary in the related art to avoid the influence of the multipole field in the return line section. For example, compared to the main line section, the return line section is separated away from the optical-axis 100 as much as possible, or a space between the main line section and the return line section is magnetically shielded. In contrast, in the present embodiment, noise caused by power source stability is reduced by utilizing the multipole field in the return line section in a positive manner. In the following description, unless otherwise specified, the noise caused by power source stability is simply referred to as noise and is distinguished from noise caused by an external device such as a stray magnetic field. Hereinafter, a principle of a measure against assumed noise in the present embodiment will be described.

An example of the noise caused by power source stability includes ripple noise in the power source 117 in FIG. 1. It is assumed that a magnetic field fluctuation is generated by a variation of output current values caused by the noise. A measure against the noise is a measure against a dipole field component of a fluctuating magnetic field. This is because fluctuation of a charged particle beam caused by the dipole field component is a dominant factor causing lower resolution of a charged particle beam apparatus. A typical measure includes usage of a highly stable power source for an aberration corrector.

It is known that a proportion of strength of a magnetic field generated by a main line section of a power source line and strength of a magnetic field generated by a return line section of the power source line is $1/R^N$ in theory (here, R represents a distance between the optical-axis and the main line section or the return line section of the power source line). Since the current in the main line section flows in a direction opposite to the current in the return line section, magnetic field strength generated by the current in the main section line is also in a direction opposite to magnetic field strength generated by the current in the return line section. Accordingly, strength of a 2N-pole field obtained by synthesizing magnetic fields in the main line section and the return line section is calculated by Formula 2 using the reference current $A_N$. Here, it is assumed that length of the main line section and the return line section is infinite and there is no influence of magnetic fields generated by current lines in the connection section 114 and the connection section 115 in FIG. 1. μ represents magnetic permeability and a wire coefficient $k_N$ is a constant determined by the number of current lines that form a wire lens and a current allocation. For example, $k_N$ is 6 in a case of the current allocation in Formula 1 and the wire lens shown in FIG. 2.

$$B_{2N} = \frac{A_N \mu}{2\pi} k_N \left( \frac{1}{R_1^N} - \frac{1}{R_2^N} \right)$$ [Formula 2]

According to Formula 2, it is known that an influence of a distance from the optical-axis varies exponentially depending on a type of a multipole field. In a case where the distance $R_1$ from the optical-axis to the main line section is considered as a constant and the distance $R_2$ from the optical-axis to the return line section is considered as a variable, a higher field (N is large) is firstly attenuated (a canceled component ($1/R_2^N$) decreases in a relatively early period) as compared with a lower field (N is small) when the distance $R_2$ increases. In other words, a condition of a large cancellation quantity of a dipole field component that is noise and a small cancellation quantity of a hexapole field component that is a correction field may be set by setting the distance $R_2$ to an appropriate distance.

FIG. 3 shows a ratio of a noise amount generated by the return line when the multipole field strength is constant for description of the above effect. In FIG. 3, a vertical axis shows a noise amount when the return line is provided, in which the noise amount is standardized by a noise amount when the return line is not provided, and a horizontal axis shows the distance $R_2$ that is standardized by the distance $R_1$. Here, the reference current $A_N$ changes corresponding to the distance $R_2$ in order to keep constant multipole field strength. That is, when the distance $R_2$ decreases, a current quantity is increased to perform correction in order to increase the cancellation quantity. As shown in FIG. 3, there is a minimum point in a case of a hexapole field where the noise amount is about 65% and the standardized distance $R_2$ is between 1.5 and 2, and the noise amount is about 81% when $R_2$ is 5. When the distance $R_2$ is 1.5 or less, practicality is low since the reference current $A_N$ increases and position robustness of the distance $R_2$ decreases (a strength change amount is large when a deviation occurs). On the other hand, a noise cancellation effect decreases when the distance $R_2$ increases. Therefore, it is desirable to set the distance R2 within in a range in which the distance $R_2$ is larger than a distance where the noise amount is minimum and the noise amount is equal to or less than a predetermined level or within a range in which the distance $R_2$ is in the vicinity of the distance where the noise amount is minimum and the noise amount is equal to or less than the predetermined level. For example, it is desirable that the distance $R_2$ is 1.5 times to 5 times the distance $R_1$ in an aberration corrector using the hexapole field.

Configuration conditions of the wire multipole lens used for canceling the noise have been described above. It is necessary to use a plurality of multipole lenses to operate the aberration corrector. FIG. 4 is a schematic diagram showing, as a configuration example of an entire electron beam apparatus, all configuration components including the aberration corrector according to the present embodiment. A primary electron beam is emitted from an electron gun 141, is formed into a parallel beam by a condenser lens 142, and passes through a multipole lens 143 in the apparatus. The primary electron beam that passes through the multipole lens 143 is transferred to a multipole lens 146 by a condenser lens 144 and a condenser lens 145. Thereafter, the primary electron beam is focused by a condenser lens 147 and an objective lens 148 and is emitted onto a specimen 149. A vacuum container 140 is evacuated inside and the electron beam travels from the electron gun 141 to the specimen 149 in a state in which the vacuum container is maintained in a vacuum state. The multipole lens 143 and the multipole lens 146 are implemented by the wire multipole lens shown in FIGS. 1 and 2. A hexapole field is excited in order to perform a spherical aberration correction. Such a spherical aberration optical system is the same optical system as a general aberration corrector used in a STEM or the like. A difference is that the multipole lenses 143 and 145 are not multipoles formed of a wedge magnetic body but use the wire multipole lens as described above. The wire multipole lens may also be applied to a four-stage aberration corrector using a quadrupole field and an octupole field in addition to the aberration corrector using a hexapole field.

With regard to the expression "on the same plane" according to the present embodiment, for example, although the main line section 113 and the return line section 116 in FIG. 1 are on the same plane, the main line section 113 and the return line section 116 may be not strictly on the same plane due to an accuracy limit in actual production. Therefore, "on the same plane" according to the present embodiment refers to on the same plane in theory, or on a plane including an error considering a deviation in a rotation direction in practice. Since the error has an effect of decreasing the power source noise cancellation effect compared to a theoretical value, a deviation allowable value including both the deviation in the rotation direction and a deviation in an axial direction is set in advance. The allowable value depends on a target specification and cost. However, a criterion is set in which an allowable value of the main line section is 1 degree in the rotation direction and 2% in the axial direction, and an allowable value of the return line section is twice to four times the allowable value of the main line section. As shown in FIG. 5, grooves 119 are provided in an axisymmetric manner on the bobbin 118 and a method for positioning a current line such as the main line section and the return line section may be a method of winding the current line with the grooves 119 as a guide. A through hole may be provided in addition to the grooves.

The above has described an effect of the present embodiment of reducing the power source noise. Another effect includes reducing an influence of a positional deviation in the main line section. Specifically, the dipole field component is generated when there is a positional deviation in the main line section. The influence of the dipole field component caused by the positional deviation can be reduced at the same ratio as the noise in FIG. 3 by adding the return line. In addition, an astigmatism (the quadrupole field) component can be reduced when the hexapole field or the anoctupole field is excited. That is, even when a multipole lens is manufactured with the same mechanical accuracy, the multipole lens can be manufactured with high accuracy by adding the return line. Finally, when superimposition of lower field components is not necessary, the main line section may be connected in series and operated using a single power source. Noise and cost are expected to be further reduced.

Second Embodiment

Compared to the configuration according to the first embodiment, FIG. 6 shows a configuration to further improve the effect of reducing noise caused by power source stability. In a multipole lens shown in FIG. 6, the current line 101 and the current line 107 are provided in an axisymmetric manner around the optical-axis 100 of the charged particle beam on the same plane, and an annular magnetic path 120 formed of a magnetic body such as pure iron or a permalloy is provided on an outer periphery of a return line section of the current line 101 and the current line 107. Although the bobbin 118 and the like are omitted in FIG. 6, the basic configuration in FIG. 6 is similar to the configuration according to the first embodiment. Although the magnetic path 120 has an effect of increasing magnetic field strength of a current line, the magnetic field strength increases depending on a type of a multipole field. The magnetic field strength varies depending on a distance ΔGp between the current line and an inner diameter of the magnetic path 120. A specific example of a relationship between the magnetic field strength and the inner diameter is shown in FIG. 7. Here, it is assumed that there is an inner diameter of an annular ring of the magnetic path 120 at a position separated by ΔGp from a main line section and an outer periphery of the main line section. In FIG. 7, a vertical axis shows multipole field strength standardized by strength in a state where no magnetic path is provided, and a horizontal axis shows the distance ΔGp ($R_1$=3 mm). As described above, the multipole field strength is increased by providing the magnetic path and a rate of change of the multipole field strength is different depending on a type of the multipole field even at the same ΔGp. This characteristic is used to further improve the noise reducing effect and stability required for a power source is reduced according to the second embodiment.

A principle of improving noise reduction using the magnetic path will be described using a simplified formula. Similar to Formula 2 in the first embodiment, it is assumed that length of the main line section 113 and the return line section 116 is infinite and there is no influence from power source lines in the connection section 114 and the connection section 115. When the magnetic path 120 is provided, coefficients $a_N$ and $b_N$ that are different from two terms in Formula 2 may be used.

$$B_{2N} = \frac{A_N \mu}{2\pi} k_N \left( \frac{a_N}{R_1^N} - \frac{b_N}{R_2^N} \right) \quad \text{[Formula 3]}$$

To be simple, $a_N$ is considered as a constant when the main line section and the magnetic path are sufficiently separated and $b_N$ is also a constant when a distance between the return line and the magnetic path is constant. In Formula 2 according to the first embodiment, a condition ($B_2$=0) in which a dipole field component caused by noise is zero is when $R_1$=$R_2$. Under the condition, other multipole field components are also zero. In contrast, according to Formula 3, a condition in which the dipole field component caused by noise is zero is when $R_2$=$R_1 \times (b_1/a_1)$, and $b_1 > a_1$ since the magnetic path is in the vicinity of the return line. At this time, a condition in which other higher multipole fields are zero is limited to when coefficients $a_N$ and $b_N$ satisfy a relationship of Formula 4, otherwise the higher multipole fields may have finite values. That is, the magnetic path 120 is added to ensure that the multipole field strength necessary for correction by calculation has a finite value and only the dipole component caused by the noise may be completely removed.

$$\frac{a_N}{b_N} = \frac{a_1^N}{b_1^N} \quad \text{[Formula 4]}$$

FIG. 8 shows an example in which an effect of adding the magnetic path is applied to an actual system ($R_1$=3 mm and the distance ΔGp between the inner diameter of the magnetic path and the return line is 0.5 mm). FIG. 8 is a graph corresponding to FIG. 3 in the first embodiment. A vertical axis shows a noise amount when the return line is provided, in which the noise amount is standardized by a noise amount when the return line is not provided, and a horizontal axis shows the distance $R_2$ that is standardized by the distance $R_1$. Similar to FIG. 3, the reference current $A_N$ changes corresponding to the distance $R_2$ in order to keep the multipole field strength constant. Under a condition shown in FIG. 8, since the distance between the main line section and the magnetic path is relatively small, a change of the coefficient $a_N$ in Formula 3 may not be ignored and a condition in which the noise is completely zero may not be satisfied. However, the effect of adding the magnetic path can be seen by including an $R_2$ condition in which the noise amount is smaller than the noise amount in FIG. 3. However, when $R_2$ increases (for example, $R_2$>5 in the present embodiment), the noise amount may be larger than the noise amount when no magnetic path is provided. As a result, the noise is not reduced by only adding the magnetic path.

With regard to the distance ΔGp between the inner diameter of the magnetic path 120 and the return line, an influence of $R_2$ is stronger than an influence of ΔGp on strength of a multipole field higher than the dipole field and a cancellation influence caused by ΔGp is small. Accordingly, ΔGp may be reduced for noise cancellation and is desirably reduced to be smaller than $R_2$.

Third Embodiment

Compared to the configuration according to the second embodiment, FIG. 9 shows a configuration to further improve an effect of reducing noise compared to the effect in the second embodiment. Based on the configuration according to the second embodiment, an extension line section 121 of the current line 107 is wound on the magnetic path 120 and the return line section 116 is doubled. At this time, it is desirable that current lines where the return line section 116 is doubled are provided on a plane formed by the current line 107 in a symmetrical manner and at the same distance from the optical-axis 100, and are in contact with each other. A magnetic field generated by an outermost periphery section 122 that is outward of the magnetic path 120 on the extension line section 121 has no influence on an optical-axis side relative to the magnetic path 120 since the magnetic path 120 that is a magnetic body in between serves as a magnetic shield. Although FIG. 9 shows an example in which the return line is doubled, the number of multiplexing the return line is not limited. However, it is required that currents in return line sections flow in the same direction.

An effect of multiplexing the return line section is that a noise cancellation effect increases in proportion to an increase in the number of winding. Similar to the second embodiment, when length of the main line section and the return line section is approximate to infinite and the main line section and the magnetic path are sufficiently separated, the coefficient of the return line section in Formula 3 is multiplied by the number of winding M (M is a natural number) as shown in Formula 5.

$$B_{2N} = \frac{A_N \mu}{2\pi} k_N \left( \frac{a_N}{R_1^N} - \frac{M b_N}{R_2^N} \right) \quad \text{[Formula 5]}$$

A condition in which a dipole field component caused by noise is zero is when $R_2$=$MR_1 \times (b_1/a_1)$. The return line section is provided at a position farther separated from the optical-axis 100 compared to a case where the return line section is not multiplexed. This is advantageous in that degree of freedom in manufacturing and design is increased and space is expanded.

With regard to the noise amount when the return line section is multiplexed, FIG. 10 shows an effect example when the return line is doubled ($R_1$=3 mm and the distance ΔGp between an inner diameter of the magnetic path and the return line section is fixed to 0.5 mm). In FIG. 10, a vertical axis shows the noise amount when the return line is doubled, in which the noise amount is standardized by a noised amount when the return line and the magnetic path are not provided, and a horizontal axis shows the distance $R_2$ standardized by the distance $R_1$. Similar to the first embodiment and the second embodiment, the reference current $A_N$ changes corresponding to the distance $R_2$ in order to keep constant multipole field strength. Compared with FIG. 8 in the second embodiment, it can be known that a noise reducing ratio is increased by doubling the return line, an $R_2$ arrange in which the noise amount is equal to or less than a predetermined amount (for example, an $R_2$ arrange in which a standardized noise amount is equal to or less than 0.6) increases and an $R_2$ position where the noise amount is minimum also shifts towards an increasing direction. Compared with the second embodiment, a current quantity required when the same noise reducing ratio is obtained is reduced within a practical arrange of $R_2$.

Fourth Embodiment

In the third embodiment, the return line section is multiplexed by winding the current line on the magnetic path 120. Alternatively, a configuration without the magnetic path 120 as shown in FIG. 11 may be provided. At this time, the outermost periphery section 122 is provided farther than the return line section 116 (a distance $R_3$ between the outermost periphery section 122 and the optical-axis is larger than the distance $R_2$). Similar to the third embodiment, when length of the main line section and the return line section is approximate to infinite, multipole field strength is calculated by Formula 6. Formula 6 is obtained by multiplexing an effect of the return line (a second item) in Formula 2 and adding a third item that is an effect of the outermost periphery section 122.

$$B_{2N} = \frac{A_N \mu}{2\pi} k_N \left( \frac{1}{R_1^N} - \frac{M}{R_2^N} + \frac{(M-1)}{R_3^N} \right) \quad \text{[Formula 6]}$$

If the added third item is considered as zero in a case of $R_3 \gg R_2$, a condition in which a dipole field component caused by noise is zero is when $R_2 = MR_1$ and Formula 6 may be changed to Formula 7.

$$B_{2N} = \frac{A_N \mu}{2\pi R_1^N} k_N \left( 1 - \frac{1}{M^{N-1}} \right) \quad \text{[Formula 7]}$$

Since the number of winding M is an integer equal to or larger than 2 when the return line section is multiplexed, Formula 7 is always positive even under a noise zero condition, and strength $B_{2N}$ of a multipole field higher than a dipole field is not zero.

The first to fourth embodiments describe a configuration example in which a wire shape of a current line is a quadrilateral shape and the main line section and the return line section are parallel to the optical-axis. Alternatively, the wire shape of the current line may be other shapes as long as the main line section and the return line section are provided in an axisymmetric manner on the same plane with the optical-axis and the current includes a component in parallel to the optical-axis. For example, a part of the return line may form a sub current line section 123 as shown in FIG. 12, and a configuration in which noise is canceled by only a part of a section may be provided.

In addition, the return line section 116 may have an inclined shape as shown in FIG. 13. A characteristic of a case where the return line section is inclined includes that a noise cancellation amount changes depending on a Z position. However, since noise influences are finally integrated, there is no problem even when the return line section 116 is inclined as long as the noise influences in total are reduced.

The invention is not limited to the embodiments described above and includes various modifications. For example, the embodiments described above have been described for easy understanding of the invention, and the invention is not necessarily limited to those including all the configurations described above. Further, a part of the configuration of one embodiment can be replaced with the configuration of another embodiment, and the configuration of another embodiment can be added to the configuration of one embodiment. In addition, a part of the configuration of one embodiment may be added, deleted, or replaced with another configuration.

REFERENCE SIGN LIST

100 optical-axis
101 to 112 current line
113 main line section
114, 115 connection section
116 return line section
117 power source
118 bobbin
119 groove
120 annular magnetic path
121 extension line section
122 outermost periphery section
123 sub current line section
140 vacuum container
141 electron gun
142, 144, 145, 147 condenser lens
143, 146 multipole lens
148 objective lens
149 specimen

The invention claimed is:

1. A multipole lens comprising:
a plurality of pairs of current lines that are each provided on a same plane in an axisymmetric manner around an optical-axis, wherein
the current lines each include a main line section that is parallel to the optical-axis and a return line section that faces the main line section,
a current in the return line section flows in a direction opposite to a current in the main line section in components parallel to the optical-axis,
a distance between the optical-axis and the return line section is larger than a distance between the optical-axis and the main line section, and noise caused by stability of a power source that supplies a current to the current lines in an excited multipole field is equal to or less than a predetermined level, and
the distance between the optical-axis and the return line section is 1.5 times to 5 times the distance between the optical-axis and the main line section.

2. The multipole lens according to claim 1, wherein
no magnetic body is provided between the main line section and the return line section of the current lines.

3. The multipole lens according to claim 1, wherein
an annular magnetic path is provided on an outer periphery of the return line section of the current lines, and
a distance between an inner diameter of the magnetic path and the return line section is equal to or less than the distance between the optical-axis and the return line section.

4. An aberration corrector comprising:
the multipole lens according to claim 1.

5. A multipole lens comprising:
a plurality of pairs of current lines that are each provided on a same plane in an axisymmetric manner around an optical-axis, wherein
the current lines each include a main line section that is parallel to the optical-axis and a return line section that faces the main line section,
a current in the return line section flows in a direction opposite to a current in the main line section in components parallel to the optical-axis,
a distance between the optical-axis and the return line section is larger than a distance between the optical-axis and the main line section, and noise caused by stability of a power source that supplies a current to the current lines in an excited multipole field is equal to or less than a predetermined level,
under a condition in which strength of the multipole field is constant, a noise amount caused by power source instability when the return line section is provided relative to a noise amount caused by power source instability when the return line section is not provided changes depending on the distance between the optical-axis and the return line section relative to the distance between the optical-axis and the main line section and has a minimum value at a predetermined distance, and
the distance between the optical-axis and the return line section is larger than the predetermined distance where the minimum value is obtained.

6. The multipole lens according to claim 5, wherein
the distance between the optical-axis and the return line section is 1.5 times to 5 times the distance between the optical-axis and the main line section.

7. The multipole lens according to claim 5, wherein
no magnetic body is provided between the main line section and the return line section of the current lines.

8. The multipole lens according to claim 5, wherein
an annular magnetic path is provided on an outer periphery of the return line section of the current lines, and
a distance between an inner diameter of the magnetic path and the return line section is equal to or less than the distance between the optical-axis and the return line section.

9. An aberration corrector comprising:
the multipole lens according to claim 5.

10. A multipole lens comprising:
a plurality of pairs of current lines that are each provided on a same plane in an axisymmetric manner around an optical-axis, wherein
the current lines each include a main line section that is parallel to the optical-axis, a return line section that is multiplexed and faces the main line section, and an outermost periphery section that faces the return line section,
a current in the return line section flows in a direction opposite to a current in the main line section and a current in the outermost periphery section in components parallel to the optical-axis, and
a distance between the optical-axis and the return line section is larger than a distance between the optical-axis and the main line section, and is smaller than a distance between the optical-axis and the outermost periphery section.

11. The multipole lens according to claim 10, wherein
the distance between the optical-axis and the return line section is set such that noise caused by stability of a power source that supplies a current to the current lines in an excited multipole field is equal to or less than a predetermined level.

12. The multipole lens according to claim 10, wherein
no magnetic body is provided between the main line section and the return line section of the current lines.

13. The multipole lens according to claim 10, wherein
an annular magnetic path is provided between the return line section and the outermost periphery section of the current lines.

14. An aberration corrector comprising:
the multipole lens according to claim 10.

15. A charged particle beam apparatus comprising:
an electron gun that emits a primary electron beam;
an aberration corrector into which the primary electron beam is emitted and includes a multipole lens in multiple stages; and
an objective lens into which the primary electron beam that passes through the aberration corrector is emitted, wherein
the multipole lens includes a plurality of pairs of current lines that are each provided on a same plane in an axisymmetric manner around an optical-axis, the current lines each include a main line section that is parallel to the optical-axis, a return line section that is multiplexed and faces the main line section, and an outermost periphery section that faces the return line section, and a current in the return line section flows in a direction opposite to a current in the main line section in components parallel to the optical-axis, a distance between the optical-axis and the return line section is larger than a distance between the optical-axis and the main line section, and noise caused by stability of a power source that supplies a current to the current lines in an excited multipole field is equal to or less than a predetermined level.

16. The charged particle beam apparatus according to claim 15, wherein
the aberration corrector includes a hexapole field.

17. A charged particle beam apparatus comprising:
an electron gun that emits a primary electron beam;
an aberration corrector into which the primary electron beam is emitted and includes a multipole lens in multiple stages; and
an objective lens into which the primary electron beam that passes through the aberration corrector is emitted, wherein
the multipole lens includes a plurality of pairs of current lines that are each provided on a same plane in an axisymmetric manner around an optical-axis, the current lines each include a main line section that is parallel to the optical-axis, a return line section that is multiplexed and faces the main line section, and an outermost periphery section that faces the return line section, a current in the return line section flows in a direction opposite to a current in the main line section and a current in the outermost periphery section in components parallel to the optical-axis, and a distance between the optical-axis and the return line section is larger than a distance between the optical-axis and the main line section and is smaller than a distance between the optical-axis and the outermost periphery section.

18. The charged particle beam apparatus according to claim 17, wherein
the aberration corrector includes a hexapole field.

* * * * *